United States Patent [19]

Quach

[11] Patent Number: 5,058,264
[45] Date of Patent: Oct. 22, 1991

[54] INTEGRATED CIRCUIT INSERTOR/EXTRACTOR

[76] Inventor: Tom Quach, 2Fl., No. 3, Lane 5, Tien Mu W. Rd., Taipei, Taiwan

[21] Appl. No.: 515,773

[22] Filed: Apr. 13, 1990

Related U.S. Application Data

[63] Continuation of Ser. No. 209,981, Jun. 22, 1988, abandoned.

[51] Int. Cl.⁵ .......................................... H05K 13/04
[52] U.S. Cl. ...................................... 29/741; 29/750; 29/758; 29/278
[58] Field of Search ............... 29/741, 750, 751, 758, 29/270, 278

[56] References Cited

U.S. PATENT DOCUMENTS

| | | | |
|---|---|---|---|
| 3,628,244 | 12/1971 | Halstead | 29/758 X |
| 4,172,317 | 10/1979 | Koher et al. | 29/741 X |
| 4,521,959 | 6/1985 | Sprenkle | 29/758 X |

Primary Examiner—Timothy V. Eley

[57] ABSTRACT

An I.C. insertor/extractor, which can press I.C.s on and extract the I.C.s from a printed circuit board, having an elongate handgrip element a clipping element, and a cap having a stem on its bottom end. The lower portion of the stem is maintained in the enlarged bore of the elongate body since a first C-ring is received by a groove disposed at a lower portion of the stem. The clipping element has a clipping housing with a cylindrical protrusion to be lodged in the elongate body. A spring-loaded rivet is retained within the cylindrical protrusion by a second C-ring mounted in a channel disposed at a bottom end of the cylindrical protrusion. A pair of pinching elements which are combined by a spring element is disposed under the rivet and a plate below the pinching elements has a hole on the center position of the plate to receive the rivet.

1 Claim, 5 Drawing Sheets

INTEGRATED CIRCUIT INSERTOR/EXTRACTOR

This application is a continuation of application Ser. No. 07/209,981 filed June 22, 1988 now abandoned.

BACKGROUND OF THE INVENTION

The present invention relates to an integrated circuit insertor/extractor, and more particularly relates to an insertor/extractor which can insert or extract an Integrated Circuits (I.C.) from an adapter or printed circuit boards (P.C. boards).

Some kinds of adapters have been utilized to be mounted on P.C. boards, as can be seen in FIG. 5A. The pins 60 distributed on the lower surface of the adapter 6 are in alignment with the holes 70 on the P.C. board 7. A plurality of receivers 61 shown in FIG. 5B, are disposed above the pins 60 on the upper surface of the adapter 6 to receive I.C.'s. It is more operational and secure to solder the adapter on the P.C. board than to directly solder the I.C. on the P.C. board without any interface; moreover, it is more convenient to adjust the position of I.C. on the adapter than on the I.C. board. As applied to the assembly of I.C.'s, various types of insertors have been developed to facilitate the production line, but not without their drawbacks. Conventionally, an insertor is employed to insert I.C.'s onto a P.C. board and a extractor is used to extract the I.C. from the P.C. board.

This application has arisen from work in seeking to obviate and/or mitigate the above-mentioned problem.

SUMMARY OF THE INVENTION

A primary objective of the present invention is to provide an integrated circuit (I.C.) insertor/extractor which can not only insert an I.C. on an adapter and which can also extract the I.C. from the adapter.

Another objective of the present invention is to provide an I.C. insertor/extractor which comprises a retractable handle and a clipping element.

Still another objective of the present invention is to provide an I.C. insertor/extractor which has performance characteristics superior to any heretofore available.

Further objectives and advantages of the present invention will become apparent as the following description proceeds, and the features of novelty which characterize the invention will be pointed out with particularity in the claims annexed to and forming a part of this invention.

DETAILED DESCRIPTION OF THE PREFERRED EMBODIMENT

Figure 1:
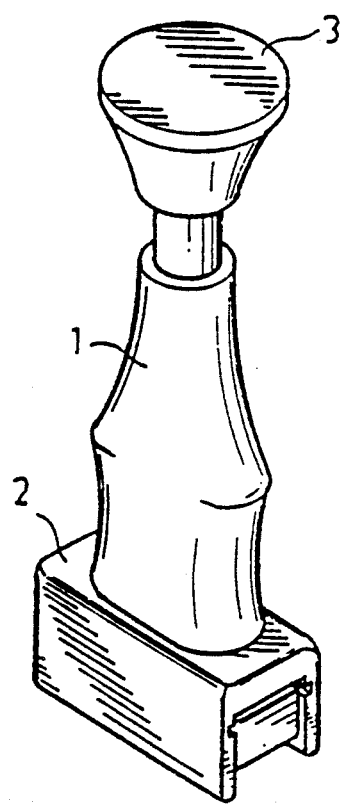
FIG. 1 is a perspective view of an integrated circuit insertor/extractor in accordance with the present invention.

With reference to the drawings and particularly to FIG. 1 thereof, it can be seen that an integrated circuit insertor/extractor in accordance with the present invention comprises an elongated handgrip element 1, a clipping element 2, and a cap 3.

Figure 2:
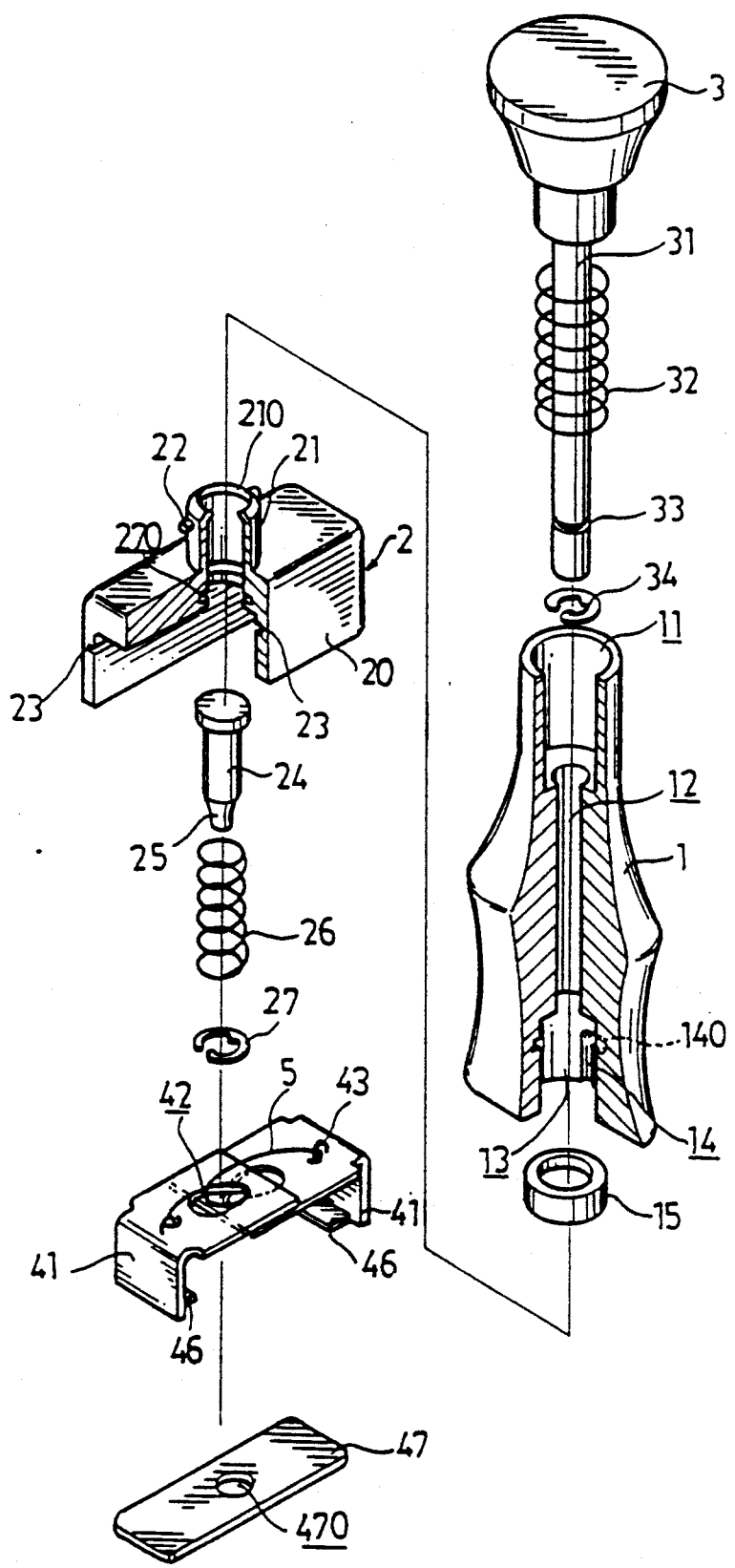
FIG. 2 is an exploded partly-cutaway view of the integrated circuit insertor/extractor of FIG. 1.

Referring to FIG. 2, it can be seen that axial bores 11, 12 and 13 are sequentially provided along the length of the elongated handgrip element 1, wherein the first axial bore 11 is formed larger than the second axial bore 12, and the second axial bore 12 is formed smaller than the third axial bore 13 which is irregular formed. The aspect of the elongated handgrip element 1 is shaped in a manner to facilitate the grasping of this invention.

A stem 31 is integrally formed on the bottom end of the cap 3, and has an annular groove 33 at the lower portion thereof for receiving a first C-ring 34. The stem 31 is encompassed by the elongated handgrip element 1 with a first spring 32 lodged in the first axial bore 11, wherein the lower portion of the stem 31 is maintained in the third axial bore 13 since the first C-ring 34 prevents the stem 31 from slipping out of the elongated handgrip element 1, against the force of the first spring 32. Therefore, a retractable handle is formed by the elongated handgrip element 1 and cap 3.

The clipping element 2 has a reverse U-shaped clipping housing 20 which comprises a cylindrical protrusion 21 with a pair of lugs 22 to be secured in the third axial bore 13 of the elongated handgrip element 1, wherein a pair of reverse hook-like slits 14 are axially provided at the third axial bore 13 to respectively receive and secure the lugs 22. Furthermore, an annular gasket 15 is packed in the left capacity of the third axial bore 13, when the protrusion 21 is wedged therein, to secure the lugs in the curved portions 140 of the slits 14.

The top rim 210 of the cylindrical protrusion 21 is formed with a smaller bore so as to retain a rivet 24 within the cylindrical protrusion 21. Moreover, a second spring 26 encompasses the rivet 24 and is against the enlarged head of the rivet 24, which is retained and retractable in the cylindrical protrusion 21 due to a second C-ring 27 housed within an annular channel 270 disposed at the bottom end of the cylindrical protrusion 21. The rivet 24 not only has a T-shaped structure, but also has a narrower end portion 25. A horizontal channel 23 is provided on the inner surface of both of lateral sides of the clipping housing 20.

The outstanding feature of this application is that the clipping element 2 has a pair of pinching elements 41 which are respectively wedged in the horizontal channel 23 when assemblied. A drop-like opening 42 and a hook 43 are provided at a short distance on the top surface of each lifting element 41 and a holding means 46 is inwardly extending from the bottom edge of each pinching element 41 to fasten the I.C. and extract the I.C. from the adapter. The pinching element 41 is formed L-shaped, then the incorporation of the pinching elements 41 has a substantially reverse U-shape, which is accomplished by a spring element 5 fixed on the hooks 43 at its distal ends in a manner that the openings 42 on respective pinching elements are partly superposed. Furthermore, a plate 47 with a central hole 470 at its center position is positioned below the corporation of the pinching elements 41, and the end portion 25 of the retractable rivet 24 through the hole 470 is hammered flat for fastening the second spring 28, second C-ring 27, pinching elements 41 and plate 47 together.

Figure 3:
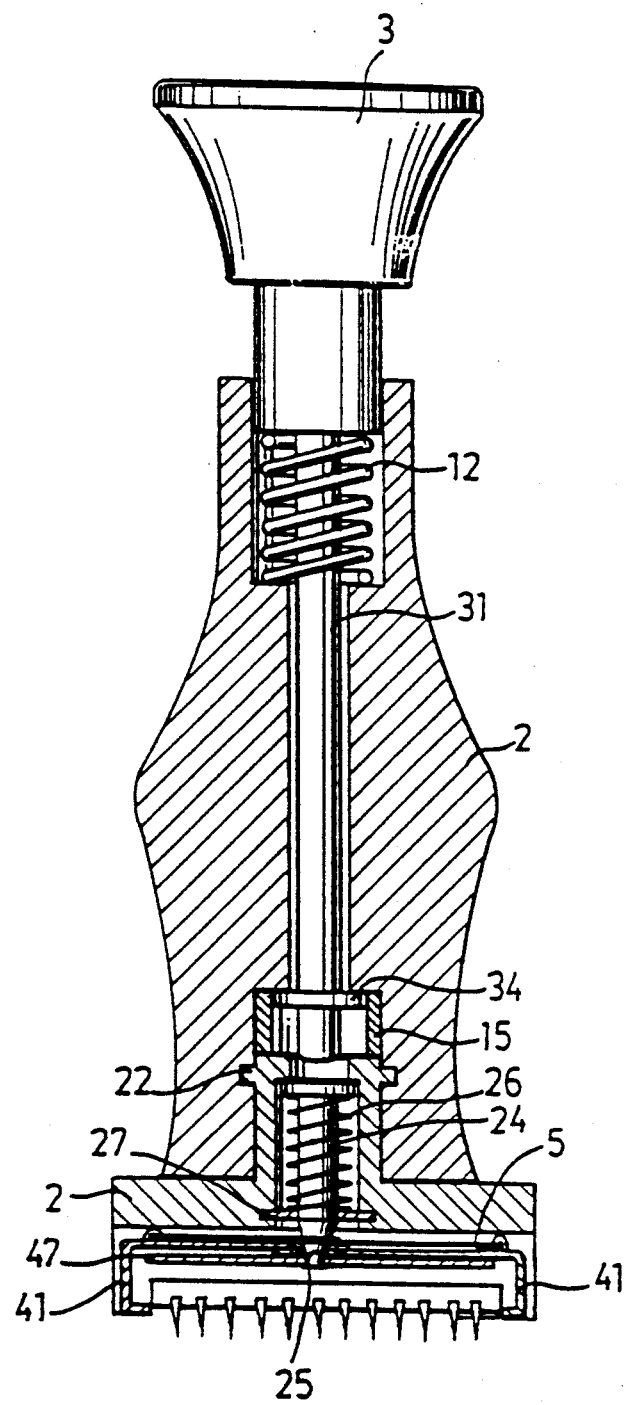
FIG. 3 is a cross-sectional view of the integrated circuit insertor/extractor of FIG. 1 when in use, illustrating that an I.C. is put in the insertor/extractor.
Figure 4:
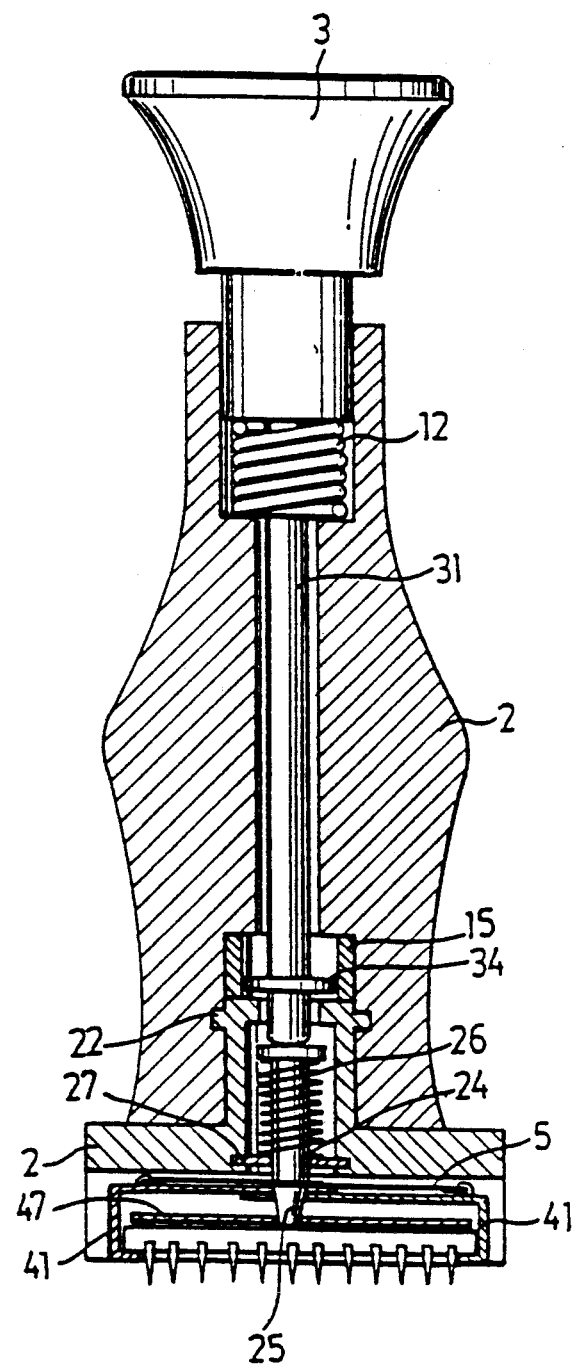
FIG. 4 is a cross-sectional view similar to FIG. 3, illustrating that an I.C. is captured by the insertor/extractor.
Figures 5A, 5B:
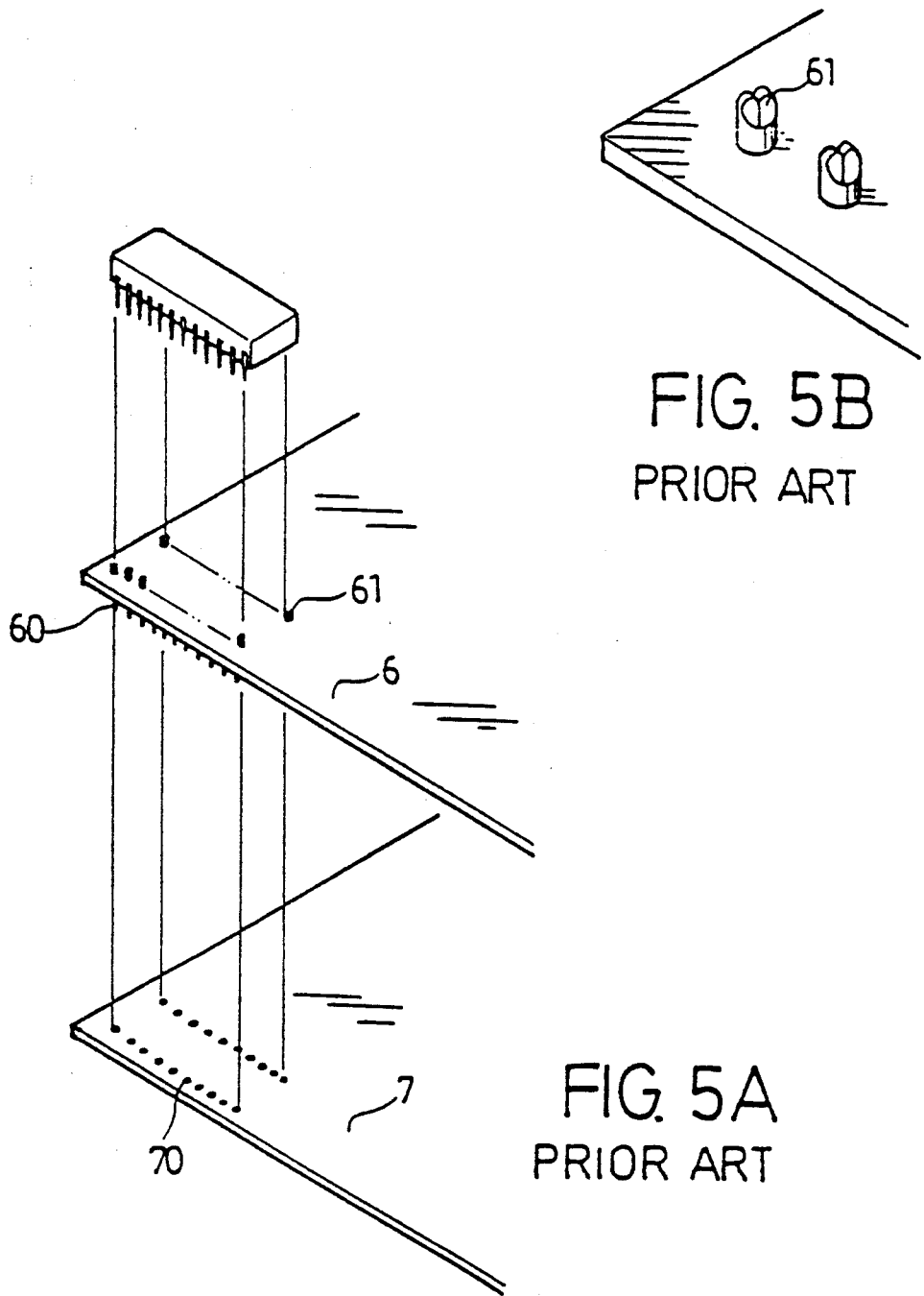
FIG. 5A is a perspective view of an integrated circuit, an adapter and a P.C. board.
FIG. 5B is an enlarged view of a receiver mounted on the adapter of FIG. 4A.

Particular with reference to FIG. 3, it can be seen that the overall structure as per the present invention is assembled, wherein an I.C. is put within, and is not captured by, this invention. It should be noted that the insertor/extractor is in open position to receive or extract an I.C. when the retractable cap is free. When the I.C. is to be carried to be put on the adapter i.e., captured by this invention, as shown in FIG. 4, the spring-loaded cap 3 is retracted so as to cause the lower portion of the stem 31 to protrude into the cylindrical protrusion 21 and force against the spring-loaded rivet 24. The recession of the rivet 24 not only enlarge the superposed portion of the openings 42 so as to shorten the distance between the pinching elements 41 to capture the I.C., but also drives the plate 47 down and tight against the I.C. on the extending means 46.

When the pressure of the spring-loaded cap 3 is released, the stem 31 and spring-loaded rivet 24 are reverted into a former state due to the forces of the first and second springs 32, 26. If the I.C. is to be extracted from the adapter 40, this can be attained by repeating the above-mentioned sequence.

While the invention has been explained in relation to its preferred embodiments, it is to be understood that various modifications thereof will become apparent to those skilled in the art upon reading this specification. Therefore, it is to be understood that the invention disclosed herein is intended to cover such modifications as fall within the scope of the appended claims.

I claim:

1. An integrated circuit insertor/extractor for inserting or extracting an integrated circuit from a printed circuit board, comprising:
   (a) an elongated handgrip element (1) having axial bores of various radii;
   (b) a cap (3) having a stem (31) on a bottom end thereof, said stem (31) encompassed by said elongated handgrip element (1) with a first spring (32) lodged in one of said bores, and having a groove (33) at a lower portion thereof receiving a first C-ring (34) to prevent said stem (31) from slipping out of said elongated handgrip element (1); and,
   (c) a clipping element (2) comprising a clipping housing (20) with a cylindrical protrusion (21) being secured in said elongated handgrip element (1); a spring-loaded rivet (24) being retained within said cylindrical protrusion (21) by a second C-ring (27); a pair of pinching elements (41), with an inwardly extending means for placement (46) on a bottom integrated circuit, said pinching elements (41) being disposed under said rivet (24); and a plate (47) below said pinching elements (41) having a central hole (470) receiving said rivet (24), said spring-loaded rivet (24) having an end portion (25) for fastening said second C-ring (27), pinching elements (41) and plate (47) together.

* * * * *